(12) United States Patent
Kim

(10) Patent No.: US 9,559,156 B2
(45) Date of Patent: Jan. 31, 2017

(54) ORGANIC LIGHT EMITTING DIODE DISPLAY

(71) Applicant: LG Display Co., Ltd., Seoul (KR)

(72) Inventor: Changnam Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 36 days.

(21) Appl. No.: 14/560,777

(22) Filed: Dec. 4, 2014

(65) Prior Publication Data

US 2015/0145756 A1 May 28, 2015

Related U.S. Application Data

(62) Division of application No. 12/846,458, filed on Jul. 29, 2010, now Pat. No. 8,912,983.

(30) Foreign Application Priority Data

Apr. 16, 2010 (KR) .................. 10-2010-0035152

(51) Int. Cl.
G09G 3/3208 (2016.01)
H01L 27/32 (2006.01)
G09G 3/32 (2016.01)

(52) U.S. Cl.
CPC ......... *H01L 27/3279* (2013.01); *G09G 3/3208* (2013.01); *H01L 27/329* (2013.01); *G09G 2300/0413* (2013.01)

(58) Field of Classification Search
None
See application file for complete search history.

(56) References Cited

U.S. PATENT DOCUMENTS

| | | | |
|---|---|---|---|
| 5,457,289 A | 10/1995 | Huang et al. | |
| 6,380,998 B1 | 4/2002 | Arai | |
| 6,399,962 B1 | 6/2002 | Kim | |
| 6,501,466 B1 | 12/2002 | Yamagishi et al. | |
| 8,912,983 B2 * | 12/2014 | Kim | H01L 27/3279 257/72 |
| 2002/0101553 A1 | 8/2002 | Enomoto et al. | |
| 2002/0126236 A1 | 9/2002 | Hiratsuka et al. | |
| 2005/0052582 A1 | 3/2005 | Mai | |
| 2005/0140279 A1 * | 6/2005 | Park | H01L 27/3276 313/504 |
| 2008/0180591 A1 | 7/2008 | Shie | |
| 2010/0072482 A1 * | 3/2010 | Eom | H01L 27/3276 257/72 |

\* cited by examiner

*Primary Examiner* — Seokyun Moon
(74) *Attorney, Agent, or Firm* — Dentons US LLP

(57) ABSTRACT

An organic light emitting diode display includes a substrate including a display area and a non-display area, a display unit that is formed in the display area and includes a plurality of subpixels arranged in a matrix form, a main ground line that is positioned at a first side of the non-display area and is formed using the same material as source and drain electrodes included in each subpixel, and an auxiliary ground line that is formed to surround the non-display area, overlaps at least a portion of the main ground line at the first side of the non-display area, is electrically connected to the main ground line, and is formed using the same material as a lower electrode included in each subpixel.

17 Claims, 9 Drawing Sheets

ORGANIC LIGHT EMITTING DIODE DISPLAY

This application is a Divisional of application Ser. No. 12/846,458, filed Jul. 29, 2010, now allowed, which claims priority to Korean Patent Application No. 10-2010-0035152 filed on Apr. 16, 2010, all of which are hereby incorporated by reference for all purposes as if fully set forth herein.

BACKGROUND OF THE INVENTION

Field of the Invention

Embodiments of the invention relate to an organic light emitting diode (OLED) display.

Description of the Related Art

An organic light emitting element used in an organic light emitting diode (OLED) display has a self-emission structure in which a light emitting layer is formed between two electrodes on a substrate. The OLED display may be classified into a top emission type OLED display, a bottom emission type OLED display, and a dual emission type OLED display depending on an emitting direction of light. The OLED display may be classified into a passive matrix type OLED display and an active matrix type OLED display depending on a driving manner.

In the OLED display, each of a plurality of subpixels includes a transistor unit and a light emitting unit. The transistor unit includes a switching transistor, a driving transistor, and a capacitor, and the light emitting unit includes a lower electrode connected to the driving transistor, an organic light emitting layer, and an upper electrode. When a scan signal, a data signal, a power, etc. are supplied to the plurality of subpixels arranged in a matrix form, the selected subpixels emit light to thereby display an image.

When a related art OLED display panel is designed, a width of a ground line formed in a bezel area increases in consideration of a line resistance. However, an increase in the width of the ground line results in an increase in the bezel area. On the other hand, when the width of the ground line decreases, the line resistance increases.

SUMMARY OF THE INVENTION

In one aspect, there is an organic light emitting diode display comprising a substrate including a display area and a non-display area, a display unit formed in the display area, the display unit including a plurality of subpixels arranged in a matrix form, a main ground line that is positioned at a first side of the non-display area and is formed using the same material as source and drain electrodes included in each subpixel, and an auxiliary ground line that is formed to surround the non-display area, overlaps at least a portion of the main ground line at the first side of the non-display area, is electrically connected to the main ground line, and is formed using the same material as a lower electrode included in each subpixel.

In another aspect, there is an organic light emitting diode display comprising a substrate including a display area and a non-display area, a display unit formed in the display area, the display unit including a plurality of subpixels arranged in a matrix form, a main ground line that is formed to surround the non-display area and is formed using the same material as source and drain electrodes included in each subpixel, and an auxiliary ground line that is formed to surround the non-display area, overlaps at least a portion of the main ground line at a first side of the non-display area, is electrically connected to the main ground line, and is formed using the same material as a lower electrode included in each subpixel.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Reference will now be made in detail embodiments of the invention examples of which are illustrated in the accompanying drawings.

Figure 1:
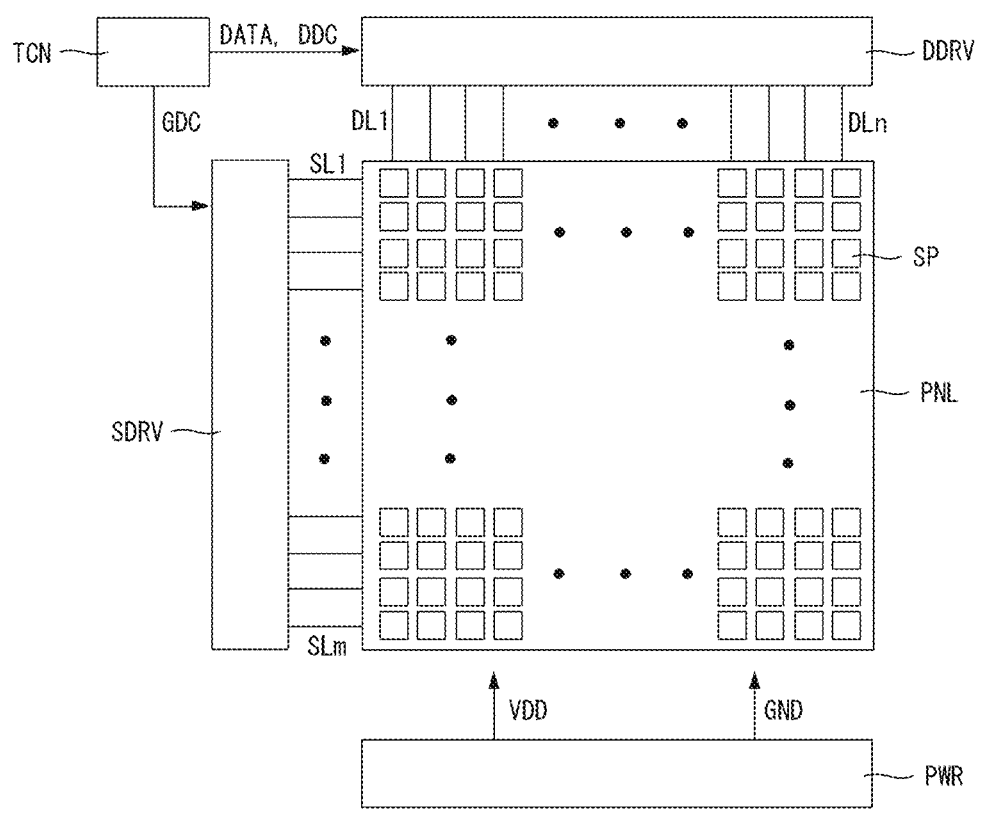
FIG. 1 is a block diagram schematically illustrating an organic light emitting diode (OLED) display.
Figure 2:
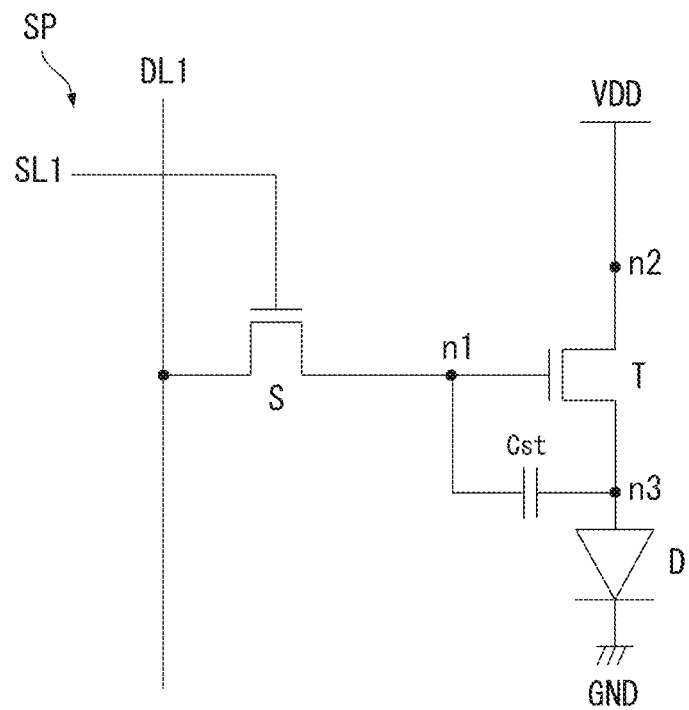
FIG. 2 illustrates a circuit configuration of a subpixel shown in FIG. 1.

FIG. 1 is a block diagram schematically illustrating an organic light emitting diode (OLED) display. FIG. 2 illustrates a circuit configuration of a subpixel shown in FIG. 1.

As shown in FIGS. 1 and 2, the OLED display includes a timing controller TCN, a data driver DDRV, a scan driver SDRV, a power supply unit PWR, and a panel PNL.

The timing controller TCN controls the data driver DDRV using a data driving signal DDC, and at the same time controls the scan driver SDRV using a gate driving signal GDC. The timing controller TCN converts a video signal received from the outside into a data signal DATA and supplies the data signal DATA to the data driver DDRV. The timing controller TCN may be mounted on a printed circuit board (PCB) connected to the panel PNL in an integrated circuit (IC) form.

The data driver DDRV supplies the data signal DATA to subpixels SP through data lines DL1 to DLn positioned on the panel PNL under the control of the timing controller TCN. The data driver DDRV may be mounted on the panel PNL in an IC form.

The scan driver SDRV supplies a scan signal to the subpixels SP through scan lines SL1 to SLm positioned on the panel PNL under the control of the timing controller TCN. The scan driver SDRV may be mounted on the panel PNL in an IC form or in a gate-in-panel (GIP) form.

The power supply unit PWR produces a high potential power VDD and a low potential power GND and supplies them to at least one of the timing controller TCN, the data driver DDRV, the scan driver SDRV, and the panel PNL. The power supply unit PWR may be mounted on the printed circuit board connected to the panel PNL.

The panel PNL includes the plurality of subpixels SP that are arranged on a substrate in a matrix form. The subpixels SP may be arranged in a passive matrix form or an active matrix form. As shown in FIG. 2, when the subpixels SP are arranged in the active matrix form, each of the subpixels SP may have a 2T1C structure (i.e., including two transistors T and one capacitor C) including a switching transistor S, a driving transistor T, a capacitor Cst, and an organic light emitting diode D. Alternatively, each subpixel SP may have a structure adding a transistor and a capacitor to the 2T1C structure. In the 2T1C structure, the switching transistor S, the driving transistor T, and the capacitor Cst may be defined as a transistor unit, and the organic light emitting diode D may be defined as a light emitting unit. A connection relationship between components constituting the subpixel SP having the 2T1C structure is described below with reference to FIG. 2. As shown in FIG. 2, a gate electrode of the switching transistor S is connected to the scan line SL1 to which the scan signal is supplied, one terminal of the switching transistor S is connected to the data line DL1 to which the data signal DATA is supplied, and the other terminal of the switching transistor S is connected to a first node n1. A gate electrode of the driving transistor T is connected to the first node n1, one terminal of the driving transistor T is connected to a second node n2 connected to a power supply line VDD to which the high potential power is supplied, and the other terminal of the driving transistor T is connected to a third node n3. One terminal of the capacitor Cst is connected to the first node n1, and the other terminal of the capacitor Cst is connected to the third node n3. A lower electrode of the organic light emitting diode D is connected to the third node n3, and an upper electrode of the organic light emitting diode D is connected to a ground line GND to which the low potential power is supplied.

Although an example where the transistors S and T included in each subpixel SP are of an n-type is described above, the transistors S and T may be of a p-type. Further, the high potential power supplied through the power supply line VDD may be higher than the low potential power supplied through the ground line GND. The high potential power and the low potential power are supplied by the power supply unit PWR.

The above-described subpixel SP may operate as follows. As shown in FIG. 2, when the scan signal is supplied through the scan line SL1, the switching transistor S is turned on. Next, when the data signal DATA supplied through the data line DL1 is supplied to the first node n1 via the turned-on switching transistor S, the data signal DATA is stored in the capacitor Cst as a data voltage. Next, when the scan signal is cut off and the switching transistor S is turned off, the driving transistor T is driven in accordance with the data voltage stored in the capacitor Cst. Next, when the high potential power supplied through the power supply line VDD flows through the ground line GND, the organic light emitting diode D emits one of red, green, and blue light. The driving method illustrated in FIG. 2 is only one example of the driving method of the subpixel for a help of an understanding of a circuit configuration of the subpixel, and the embodiment of the invention is not limited to the driving method of the subpixel SP illustrated in FIG. 2. Other driving methods of the subpixel may be used for the embodiment of the invention.

The structure of the OLED display according to exemplary embodiments of the invention is described below.

First Exemplary Embodiment

Figure 3:
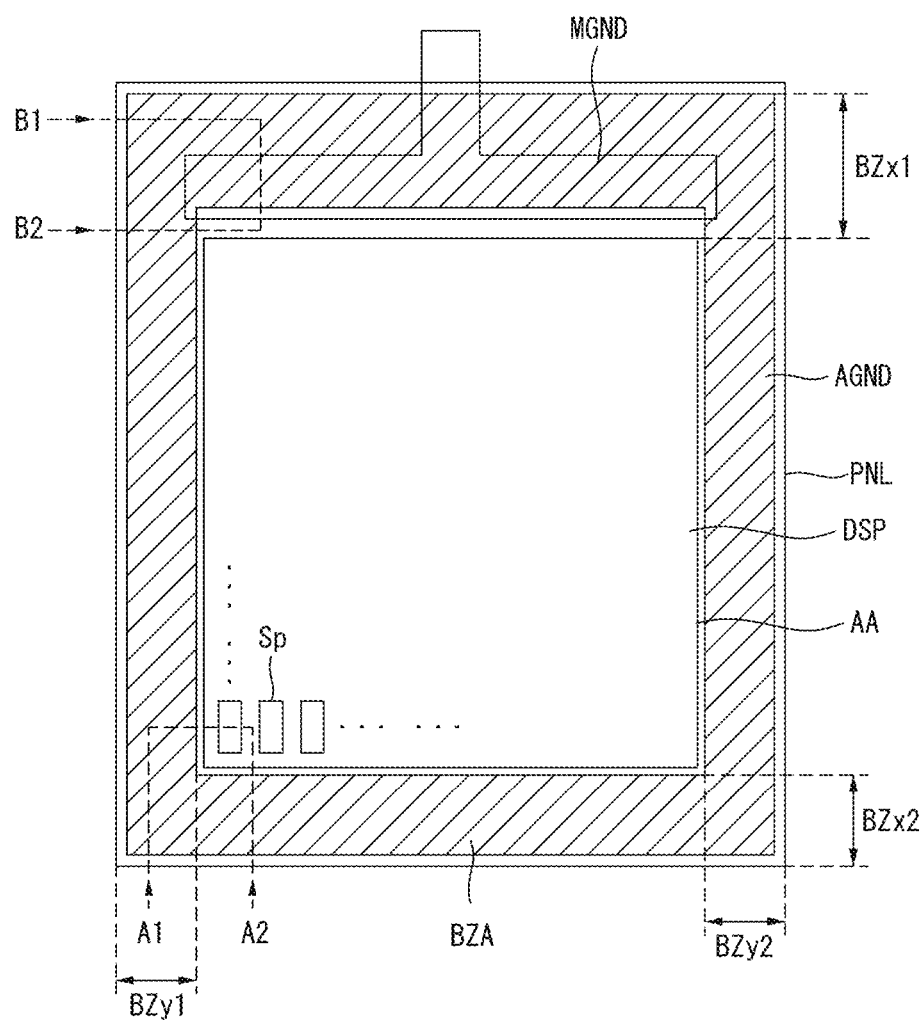
FIG. 3 is a plane view illustrating a structure of an OLED display according to a first exemplary embodiment of the invention.
Figure 4:
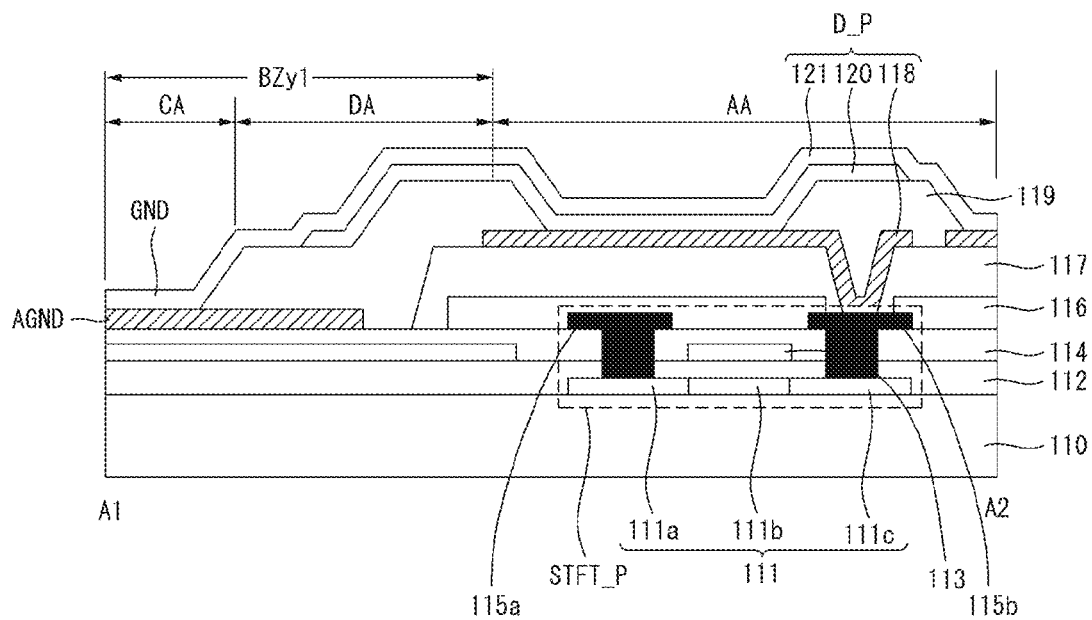
FIG. 4 is a cross-sectional view of an area A1-A2 of FIG. 3.
Figure 5:
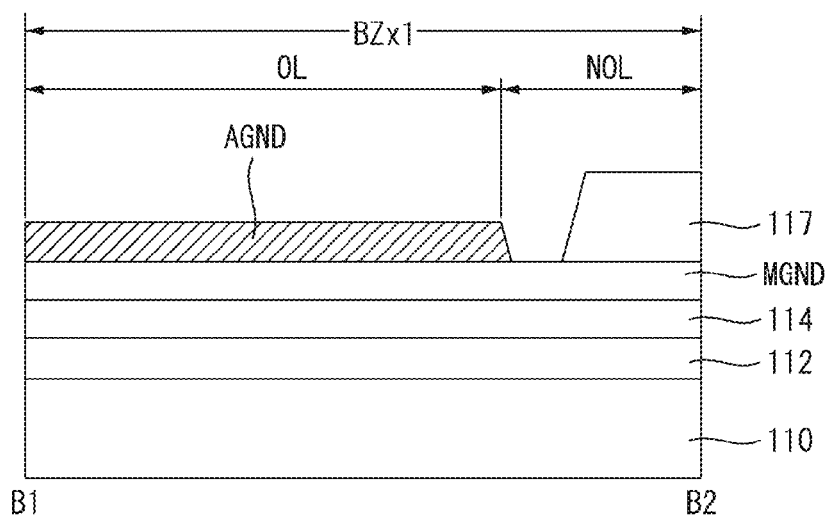
FIG. 5 is a cross-sectional view of an area B1-B2 of FIG. 3.

FIG. 3 is a plane view illustrating a structure of an OLED display according to a first exemplary embodiment of the invention. FIG. 4 is a cross-sectional view of an area A1-A2 of FIG. 3. FIG. 5 is a cross-sectional view of an area B1-B2 of FIG. 3.

As shown in FIG. 3, a substrate constituting the panel PNL includes a display area AA and non-display areas BZx1, BZx2, BZy1, and BZy2. The non-display areas BZx1, BZx2, BZy1, and BZy2 include a first non-display area BZx1 corresponding to a first side, a second non-display area BZx2 corresponding to a second side, a third non-display area BZy1 corresponding to a third side, and a fourth non-display area BZy2 corresponding to a fourth side. The display area AA is defined as a display unit DSP by the subpixels SP arranged in the matrix form. The non-display areas BZx1, BZx2, BZy1, and BZy2 are defined as a bezel area BZA by a main ground line MGND and an auxiliary ground line AGND. The main ground line MGND and the auxiliary ground line AGND on the panel PNL are connected to the ground line GND included in the subpixel SP.

The main ground line MGND is positioned in the first non-display area BZx1 and is formed using the same material as a source electrode and a drain electrode included in the subpixel SP. The auxiliary ground line AGND is formed to surround the non-display areas BZx1, BZx2, BZy1, and BZy2. The auxiliary ground line AGND overlaps at least a portion of the main ground line MGND in the first non-display area BZx1 and is electrically connected to the main ground line MGND. The auxiliary ground line AGND is formed using the same material as a lower electrode included in the subpixel SP.

Hereinafter, a structure of each of a transistor unit and a light emitting unit and a structure of each of the main ground line MGND and the auxiliary ground line AGND are described in detail with reference to FIGS. 4 and 5.

As shown in FIG. 4, a transistor unit STFT_P and a light emitting unit D_P are formed in the display area AA of a substrate 110 constituting the panel PNL. Some of components constituting the light emitting unit D_P are formed in the third non-display area BZy1 of the substrate 110 constituting the panel PNL. The transistor unit STFT_P and the light emitting unit D_P formed in the display area AA and some components of the light emitting unit D_P formed in the third non-display area BZy1 may be formed as follows. The third non-display area BZy1 includes a dummy area DA adjacent to the display area AA and a contact area CA adjacent to the outside of the substrate 110. The dummy area DA is a margin area of an organic common layer. The contact area CA is a contact area between the auxiliary ground line AGND and the ground line GND extending from an upper electrode included in the light emitting unit D_P.

An active layer 111 including a source region 111a, a channel region 111b, and a drain region 111c is formed on the substrate 110. The active layer 111 may be formed of amorphous silicon, crystallized polycrystalline silicon, or other materials, and p-type or n-type impurities may be doped on the source region 111a and the drain region 111c. A first insulating layer 112 is formed on the active layer 111.

The first insulating layer 112 may be formed of silicon oxide (SiOx), silicon nitride ($SiN_x$), or other materials. A gate electrode 113 is formed on the first insulating layer 112. The gate electrode 113 may be formed of any one selected from the group consisting of molybdenum (Mo), aluminum (Al), chromium (Cr), gold (Au), titanium (Ti), nickel (Ni), neodymium (Nd) and copper (Cu), or a combination thereof. The gate electrode 113 may have a single-layered structure or a multi-layered structure. A second insulating layer 114 is formed on the gate electrode 113. The second insulating layer 114 may be formed of silicon oxide (SiOx), silicon nitride ($SiN_x$), or other materials. A source electrode 115a connected to the source region 111a and a drain electrode 115b connected to the drain region 111c are formed on the second insulating layer 114. Each of the source electrode 115a and the drain electrode 115b may be formed of any one selected from the group consisting of Mo, Al, Cr, Au, Ti, Ni, Nd and Cu, or a combination thereof. Each of the source electrode 115a and the drain electrode 115b may have a single-layered structure or a multi-layered structure. A third insulating layer 116 is formed on the second insulating layer 114 to expose one of the source electrode 115a and the drain electrode 115b. The third insulating layer 116 may be formed of silicon oxide (SiOx), silicon nitride ($SiN_x$), or other materials. A planarization layer 117 is formed on the third insulating layer 116 to expose one of the source electrode 115a and the drain electrode 115b. The planarization layer 117 may be formed of silicon oxide (SiOx), silicon nitride ($SiN_x$), or other materials. The planarization layer 117 may have a multi-layered structure, or other structures. A lower electrode 118 electrically connected to one of the source electrode 115a and the drain electrode 115b is formed on the planarization layer 117, and the auxiliary ground line AGND is formed using the same process and the same material as the lower electrode 118. The lower electrode 118 may be selected as an anode electrode or a cathode electrode. When the lower electrode 118 is selected as the anode electrode, the anode electrode 118 may be formed of a transparent material such as indium-tin-oxide (ITO) and indium-zinc-oxide (MO), or other materials. A bank layer 119 is formed on the planarization layer 117 to expose the lower electrode 118 and a portion of the auxiliary ground line AGND. The bank layer 119 may be formed of an organic material such as benzocyclobutene (BCB)-based resin, acrylic resin, and polyimide resin. Other materials may be used. An organic light emitting layer 120 emitting one of red, green, and blue light is formed on the lower electrode 118. The organic light emitting layer 120 may include a hole transport layer, a hole injection layer, a light emitting layer, an electron injection layer, and an electron transport layer. In addition, the organic light emitting layer 120 may further include other functional layers. An upper electrode 121 is formed on the organic light emitting layer 120. The upper electrode 121 may be selected as an anode electrode or a cathode electrode. When the upper electrode 121 is selected as the cathode electrode, the cathode electrode 121 may be formed of an opaque metal such as aluminum (Al) and aluminum neodymium (AlNd). Other materials may be used.

As shown in FIG. 4, in a prior process, the lower electrode 118 that is one of the components constituting the light emitting unit D_P is dividedly formed in the dummy area DA and the contact area CA and is formed as the auxiliary ground line AGND. Further, the upper electrode 121 that is one of the components constituting the light emitting unit D_P extends to the display area AA, the dummy area DA, and the contact area CA and is formed as the ground line GND. The upper electrode 121 formed as the ground line GND is electrically connected to the auxiliary ground line AGND. The auxiliary ground line AGND is electrically connected to the main ground line MGND in the first non-display area BZx1. The connection between the auxiliary ground line AGND and the main ground line MGND is described with reference to FIG. 5.

As shown in FIG. 5, the first non-display area BZx1 of the substrate 110 includes an overlap area OL and a non-overlap area NOL. The overlap area OL is an area where the main ground line MGND and the auxiliary ground line AGND overlap each other and are electrically connected to each other. The non-overlap area NOL is an area where the main ground line MGND and the auxiliary ground line AGND do not overlap each other and are not electrically connected to each other.

The first and second insulating layers 112 and 114 are formed in the first non-display area BZx1 of the substrate 110 using the process illustrated in FIG. 4. The main ground line MGND is formed on the second insulating layer 114 using the same process and the same material as the source and drain electrodes 115a and 115b. The planarization layer 117 is formed on the main ground line MGND positioned in the non-overlap area NOL. The auxiliary ground line AGND is formed on the main ground line MGND using the same process and the same material as the lower electrode 118. The planarization layer 117 is formed on the main ground line MGND positioned in the non-overlap area NOL in the first exemplary embodiment. However, instead of the planarization layer 117, the bank layer 119 may be formed on the main ground line MGND depending on the process.

Second Exemplary Embodiment

Figure 6:
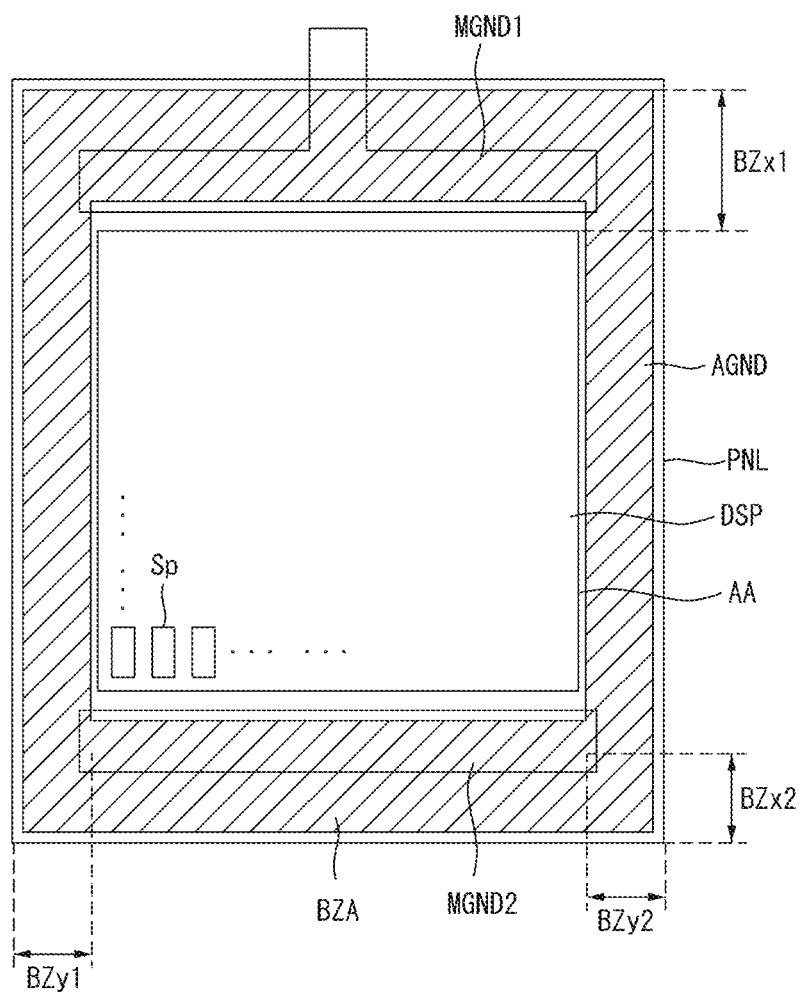
FIG. 6 is a plane view illustrating a structure of an OLED display according to a second exemplary embodiment of the invention.

FIG. 6 is a plane view illustrating a structure of an OLED display according to a second exemplary embodiment of the invention.

As shown in FIG. 6, the OLED display according to the second exemplary embodiment of the invention is substantially the same as the OLED display according to the first exemplary embodiment, except that first and second main ground lines MGND1 and MGND2 are respectively formed in first and second non-display areas BZx1 and BZx2.

Hence, the first main ground line MGND1 and an auxiliary ground line AGND partially overlap each other in the first non-display area BZx1 and are electrically connected to each other. Further, the second main ground line MGND2 and the auxiliary ground line AGND partially overlap each other in the second non-display area BZx2 and are electrically connected to each other.

Third Exemplary Embodiment

Figure 7:
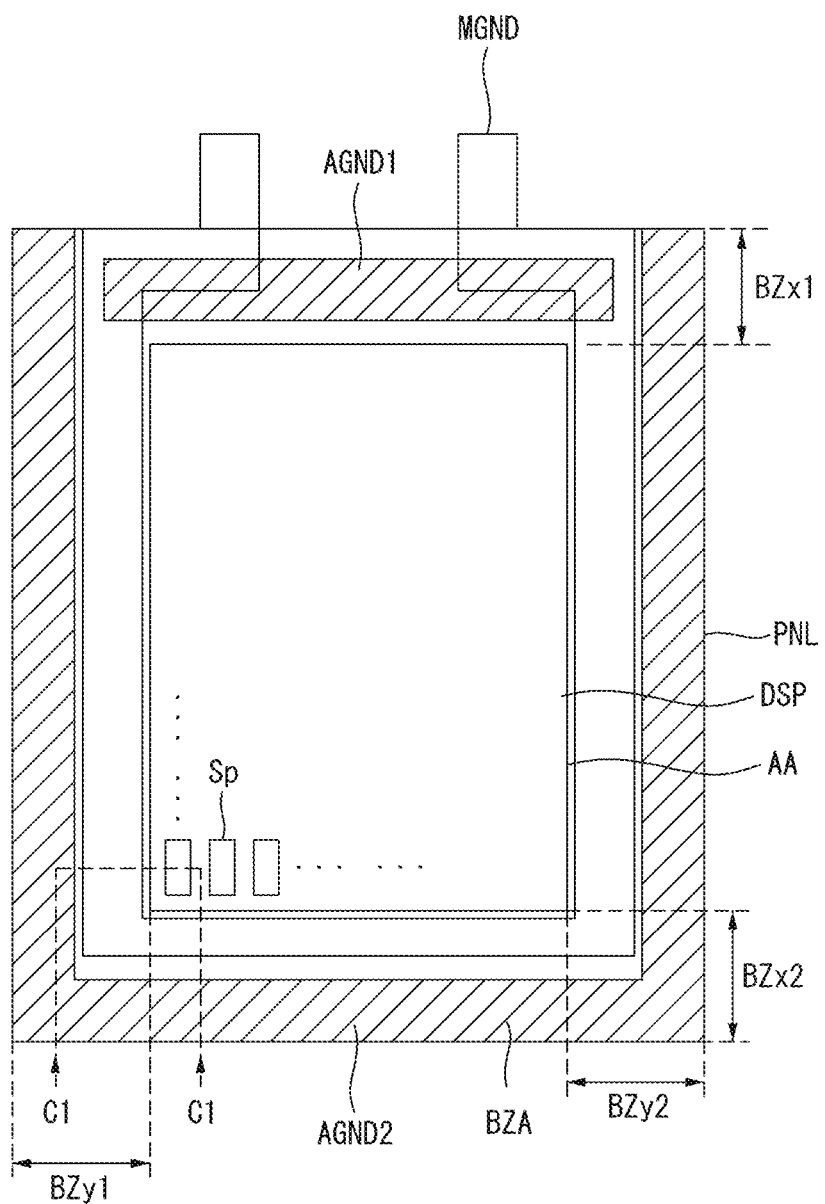
FIG. 7 is a plane view illustrating a structure of an OLED display according to a third exemplary embodiment of the invention.
Figure 8:
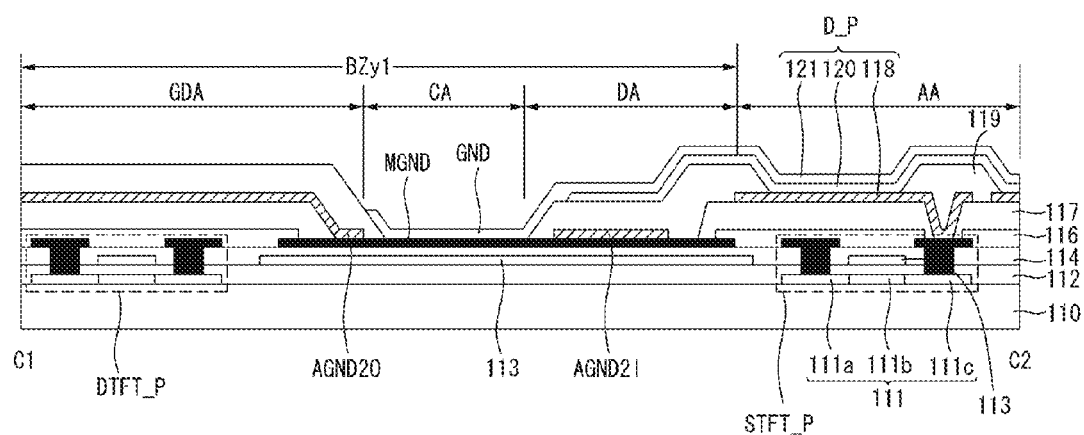
FIG. 8 is a cross-sectional view of an area C1-C2 of FIG. 7.

FIG. 7 is a plane view illustrating a structure of an OLED display according to a third exemplary embodiment of the invention. FIG. 8 is a cross-sectional view of an area C1-C2 of FIG. 7.

As shown in FIG. 7, a substrate constituting the panel PNL includes a display area AA and non-display areas BZx1, BZx2, BZy1, and BZy2. The non-display areas BZx1, BZx2, BZy1, and BZy2 include a first non-display area BZx1 corresponding to a first side, a second non-display area BZx2 corresponding to a second side, a third non-display area BZy1 corresponding to a third side, and a fourth non-display area BZy2 corresponding to a fourth side. The display area AA is defined as a display unit DSP by the subpixels SP arranged in the matrix form. The non-display areas BZx1, BZx2, BZy1, and BZy2 are defined as a bezel area BZA by a main ground line MGND and an auxiliary ground line AGND. The main ground line MGND and the auxiliary ground line AGND on the panel PNL are connected to a ground line GND included in the subpixel SP.

The main ground line MGND is positioned to surround the non-display areas BZx1, BZx2, BZy1, and BZy2. The main ground line MGND is formed using the same material as source and drain electrodes included in the subpixel SP. The main ground line MGND is patterned in the first non-display area BZx1 to have not a contour line form but a non-contour line form. The auxiliary ground line AGND is formed to surround the non-display areas BZx1, BZx2, BZy1, and BZy2. The auxiliary ground line AGND overlaps at least a portion of the main ground line MGND in the non-display areas BZx1, BZx2, BZy1, and BZy2 and is electrically connected to the main ground line MGND. The auxiliary ground line AGND is formed using the same material as a lower electrode included in the subpixel SP.

Hereinafter, a structure of each of a transistor unit and a light emitting unit and a structure of each of the main ground line MGND and the auxiliary ground line AGND are described in detail with reference to FIG. 8.

As shown in FIG. 8, a transistor unit STFT_P and a light emitting unit D_P are formed in the display area AA of a substrate 110 constituting the panel PNL. Some of components constituting the light emitting unit D_P are formed in the third non-display area BZy1 of the substrate 110 constituting the panel PNL. The transistor unit STFT_P and the light emitting unit D_P formed in the display area AA and some components of the light emitting unit D_P formed in the third non-display area BZy1 may be formed as follows. The third non-display area BZy1 includes a dummy area DA adjacent to the display area AA, a contact area CA adjacent to the dummy area DA, and a gate driving element area GDA adjacent to the outside of the substrate 110. The dummy area DA is a margin area of an organic common layer. The contact area CA is a contact area between the auxiliary ground line AGND and the ground line GND extending from an upper electrode included in the light emitting unit D_P. The gate driving element area GDA is a formation area of a gate driver DTFT_P. Namely, the gate driver DTFT_P is formed on the substrate 110 in a GIP form.

An active layer 111 including a source region 111a, a channel region 111b, and a drain region 111c is formed on the substrate 110. A first insulating layer 112 is formed on the active layer 111. A gate electrode 113 is formed on the first insulating layer 112. A second insulating layer 114 is formed on the gate electrode 113. A source electrode 115a connected to the source region 111a and a drain electrode 115b connected to the drain region 111c are formed on the second insulating layer 114. A third insulating layer 116 is formed on the second insulating layer 114 to expose one of the source electrode 115a and the drain electrode 115b. A planarization layer 117 is formed on the third insulating layer 116 to expose one of the source electrode 115a and the drain electrode 115b. A lower electrode 118 electrically connected to one of the source electrode 115a and the drain electrode 115b is formed on the planarization layer 117, and the auxiliary ground line AGND is formed using the same process and the same material as the lower electrode 118. A bank layer 119 is formed on the planarization layer 117 to expose the lower electrode 118 and a portion of the auxiliary ground line AGND. An organic light emitting layer 120 emitting one of red, green, and blue light is formed on the lower electrode 118. An upper electrode 121 is formed on the organic light emitting layer 120.

As shown in FIG. 8, in a prior process, the lower electrode 118 that is one of the components constituting the light emitting unit D_P is dividedly formed in the dummy area DA and the contact area CA and is formed as the auxiliary ground line AGND. Further, the upper electrode 121 that is one of the components constituting the light emitting unit D_P extends to the display area AA, the dummy area DA, and the contact area CA and is formed as the ground line GND. The upper electrode 121 formed as the ground line GND is electrically connected to the auxiliary ground line AGND. The main ground line MGND and the ground line GND overlap each other in the contact area CA and are electrically connected to each other. The auxiliary ground line AGND is divided into at least two parts, and the at least two parts are separated from each other on the main ground line MGND.

The second insulating layer 114 is formed in the dummy area DA, the contact area CA, and the gate driving element area GDA using the same process and the same material as the transistor unit STFT_P. The main ground line MGND is formed on the second insulating layer 114 using the same process and the same material as the source and drain electrodes 115a and 115b. An inside auxiliary ground line AGND2I is formed in the dummy area DA using the same process and the same material as the lower electrode 118. Next, the bank layer 119, the organic light emitting layer 120, and the upper electrode 121 are formed on the inside auxiliary ground line AGND2I using a process of the light emitting unit D_P.

The gate driver DTFT_P is formed in the gate driving element area GDA using the same process and the same material as the transistor unit STFT_P. Similar to the transistor unit STFT_P, the third insulating layer 116 and the planarization layer 117 are formed on the gate driver DTFT_P formed in the gate driving element area GDA. An outside auxiliary ground line AGND2O is formed on the planarization layer 117 using the same process and the same material as the lower electrode 118. The bank layer 119 may be formed on the outside auxiliary ground line AGND2O, but may be omitted.

The inside auxiliary ground line AGND2I and the outside auxiliary ground line AGND2O are formed to be separated from each other on the main ground line MGND using the above-described process. The ground line GND and the main ground line MGND overlap each other in the contact area CA and are electrically connected to each other.

Fourth Exemplary Embodiment

Figure 9:
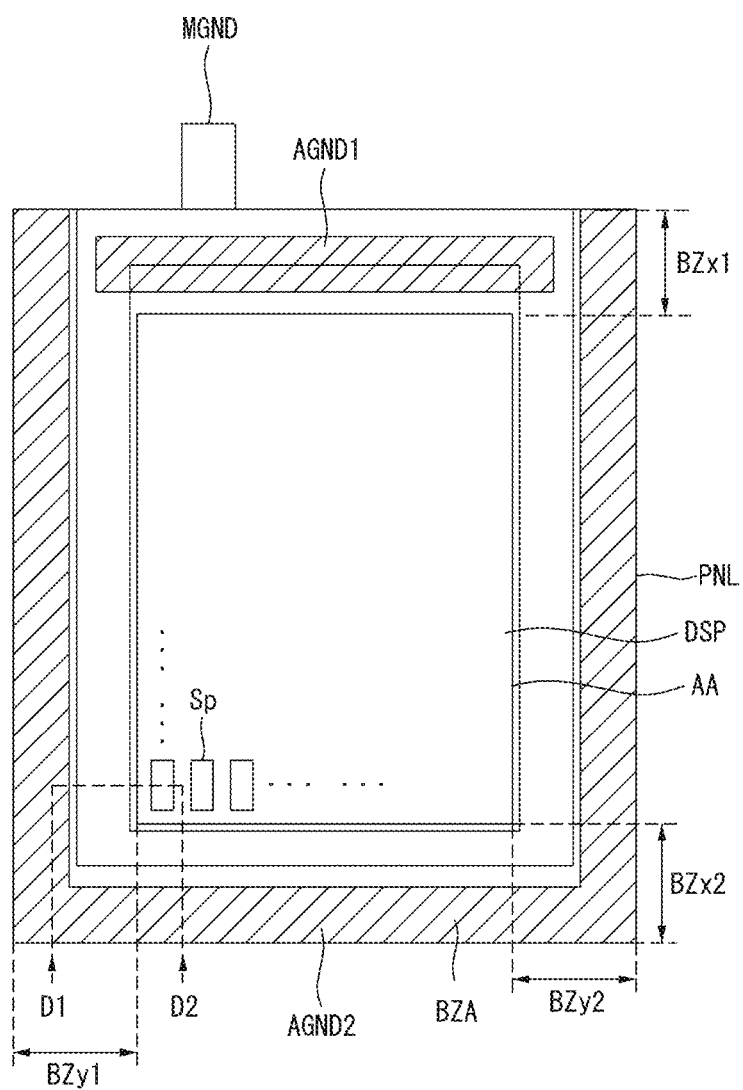
FIG. 9 is a plane view illustrating a structure of an OLED display according to a fourth exemplary embodiment of the invention.
Figure 10:
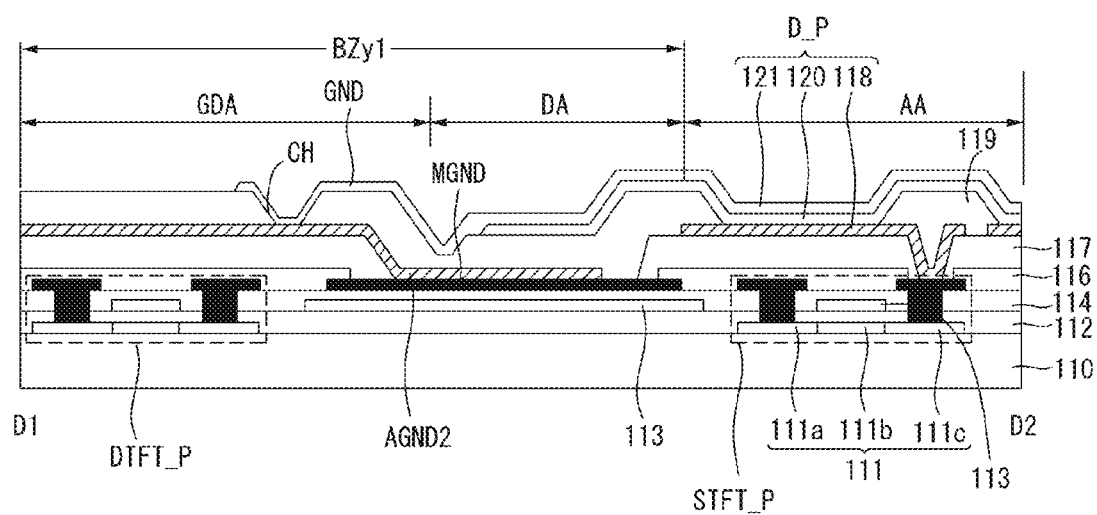
FIG. 10 is a cross-sectional view of an area D1-D2 of FIG. 9.

FIG. 9 is a plane view illustrating a structure of an OLED display according to a fourth exemplary embodiment of the invention. FIG. 10 is a cross-sectional view of an area D1-D2 of FIG. 9.

As shown in FIG. 9, a substrate constituting the panel PNL includes a display area AA and non-display areas BZx1, BZx2, BZy1, and BZy2. The non-display areas BZx1, BZx2, BZy1, and BZy2 include a first non-display area BZx1 corresponding to a first side, a second non-display area BZx2 corresponding to a second side, a third non-display area BZy1 corresponding to a third side, and a fourth non-display area BZy2 corresponding to a fourth side. The display area AA is defined as a display unit DSP by the subpixels SP arranged in the matrix form. The non-display areas BZx1, BZx2, BZy1, and BZy2 are defined as a bezel area BZA by a main ground line MGND and an auxiliary ground line AGND. The main ground line MGND and the auxiliary ground line AGND on the panel PNL are connected to a ground line GND included in the subpixel SP.

The main ground line MGND is positioned to surround the non-display areas BZx1, BZx2, BZy1, and BZy2. The main ground line MGND is formed using the same material as source and drain electrodes included in the subpixel SP. The main ground line MGND is patterned to have a contour line form. The auxiliary ground line AGND is formed to surround the non-display areas BZx1, BZx2, BZy1, and BZy2. The auxiliary ground line AGND overlaps at least a portion of the main ground line MGND in the non-display areas BZx1, BZx2, BZy1, and BZy2 and is electrically connected to the main ground line MGND. The auxiliary ground line AGND is formed using the same material as a lower electrode included in the subpixel SP.

Hereinafter, a structure of each of a transistor unit and a light emitting unit and a structure of each of the main ground line MGND and the auxiliary ground line AGND are described in detail with reference to FIG. 10.

As shown in FIG. 10, a transistor unit STFT_P and a light emitting unit D_P are formed in the display area AA of a substrate 110 constituting the panel PNL. Some of components constituting the light emitting unit D_P are formed in the third non-display area BZy1 of the substrate 110 constituting the panel PNL. The transistor unit STFT_P and the light emitting unit D_P formed in the display area AA and some components of the light emitting unit D_P formed in the third non-display area BZy1 may be formed as follows. The third non-display area BZy1 includes a dummy area DA adjacent to the display area AA and a gate driving element area GDA adjacent to the dummy area DA. The dummy area DA is a margin area of an organic common layer. The gate driving element area GDA is a formation area of a gate driver DTFT_P and is a contact area between the auxiliary ground line AGND and the ground line GND extending from an upper electrode 121 included in the light emitting unit D_P.

Because the contact area is omitted in the fourth exemplary embodiment unlike the third exemplary embodiment, the ground line GND extending from the upper electrode 121 is electrically connected to the auxiliary ground line AGND through a contact hole CH on a bank layer 119 positioned in the gate driving element area GDA.

As described above, in the OLED display according to the exemplary embodiments of the invention, because the ground line having the low resistance structure is formed inside the bezel area limited based on the structure of the panel, the line resistance is lowered and the bezel area decreases.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An organic light emitting diode display comprising:
a substrate including a display area and a non-display area;
a display unit formed in the display area, the display unit including a plurality of subpixels arranged in a matrix form;
a main ground line that is formed to surround the non-display area and is formed using the same material as source and drain electrodes of a transistor unit included in each subpixel; and
an auxiliary ground line that is formed to surround the non-display area, overlaps at least a portion of the main ground line at a first side of the non-display area, is electrically connected to the main ground line, and is formed using the same material as a lower electrode of the organic light emitting diode included in each subpixel,
wherein the material of the ground line is different from the material of the auxiliary ground line.

2. The organic light emitting diode display of claim 1, wherein at least one of the main ground line and the auxiliary ground line is electrically connected to an upper electrode included in each subpixel.

3. The organic light emitting diode display of claim 1, wherein the main ground line is formed using the same process as the source and drain electrodes included in each subpixel,
wherein the auxiliary ground line is formed using the same process as the lower electrode included in each subpixel.

4. The organic light emitting diode display of claim 1, wherein the substrate includes a bezel area defined in third and fourth sides of the non-display area,
wherein the main ground line is electrically connected to an upper electrode included in each subpixel in the bezel area.

5. The organic light emitting diode display of claim 4, wherein the auxiliary ground line is divided into at least two parts in the bezel area, and the at least two parts are separated from each other on the main ground line.

6. The organic light emitting diode display of claim 4, wherein the bezel area includes a dummy area, a contact area, and a gate driving element area divided from an area ranging from an area adjacent to the display unit to the outside of the substrate,
wherein the auxiliary ground line includes an inside auxiliary ground line formed in the dummy area and an outside auxiliary ground line formed in the gate driving element area,
wherein the main ground line extends from the dummy area to a portion of the gate driving element area and is electrically connected to the upper electrode included in each subpixel in the contact area.

7. The organic light emitting diode display of claim 4, wherein the bezel area includes a dummy area and a gate driving element area divided from an area ranging from an area adjacent to the display unit to the outside of the substrate,
wherein the auxiliary ground line extends from the dummy area to the gate driving element area,
wherein the main ground line extends from the dummy area to a portion of the gate driving element area and is electrically connected to the upper electrode included in each subpixel through a contact hole formed in a bank layer in the gate driving element area.

8. The organic light emitting diode display of claim 1, wherein each subpixel includes a transistor unit and a light emitting unit,
wherein the transistor unit includes the source electrode, the drain electrode, and a gate electrode, wherein the light emitting unit includes the lower electrode connected to one of the source electrode and the drain electrode, an organic light emitting layer, and an upper electrode connected to the main ground line.

9. An organic light emitting diode display comprising:

a substrate including a display area and a non-display area;

a display unit formed in the display area, the display unit including a plurality of subpixels arranged in a matrix form;

a main ground line that is formed to surround the non-display area and is formed using the same material as source and drain electrodes included in each subpixel; and an auxiliary ground line that is formed to surround the non-display area, overlaps at least a portion of the main ground line at a first side of the non-display area, is electrically connected to the main ground line, and is formed using the same material as a lower electrode included in each subpixel, wherein the substrate includes a bezel area defined in third and fourth sides of the non-display area, wherein the main ground line is electrically connected to an upper electrode included in each subpixel in the bezel area, and wherein the auxiliary ground line is divided into at least two parts in the bezel area, and the at least two parts are separated from each other on the main ground line.

10. An apparatus comprising:

a substrate having an array of pixels, each pixel including a plurality of sub-pixels configured to emit light from organic light emitting layers, sandwiched between a cathode and an anode, according to control from a pixel driving circuit comprised of at least one driving transistor, one switching transistor, and one capacitor for each sub-pixel;

a first ground line in a bezel area of said substrate and disposed along at least three sides of the array of pixels, operatively connected with said cathode, and made of the same material as that of source/drain electrodes of at least one among said driving transistor and said switching transistor; and a second ground line in said bezel area of said substrate and disposed along at least three sides of the array of pixels, operatively connected with said first ground line, and made of a material different from that of said first ground line, said first ground line and said second ground line having portions that overlap each other in said bezel area along one side of said array of pixels.

11. The apparatus of claim 10, wherein said second ground line is in direct contact with said first ground line at the portions that overlap each other.

12. The apparatus of claim 11, further comprising a planarization layer interposed between the first and second ground lines.

13. The apparatus of claim 12, further comprising a bank layer interposed between said cathode and said second ground line.

14. The apparatus of claim 13, wherein said cathode is in direct contact with said second ground line through an opening portion of said bank layer in said bezel area.

15. The apparatus of claim 14, wherein said first ground line is in direct contact with said second ground line through an opening portion of said planarization layer in said bezel area.

16. The apparatus of claim 15, further comprising a gate electrode under at least the portions of first and second ground lines that overlap each other.

17. The apparatus of claim 15, wherein said opening portion of said bank layer and said opening portion of said planarization layer are spaced each other.

* * * * *